(12) United States Patent
Jiao et al.

(10) Patent No.: US 7,300,820 B2
(45) Date of Patent: Nov. 27, 2007

(54) ADHESIVE ASSEMBLY FOR A CIRCUIT BOARD

(75) Inventors: Jinbao Jiao, Gurnee, IL (US); Kevin D. Moore, Hoffman Estates, IL (US); Thomas P. Gall, Northbrook, IL (US); William C. Weigler, New Braunsfels, TX (US)

(73) Assignee: Temic Automotive of North America, Inc., Deer Park, IL (US)

( * ) Notice: Subject to any disclaimer, the term of this patent is extended or adjusted under 35 U.S.C. 154(b) by 0 days.

(21) Appl. No.: 10/801,894

(22) Filed: Mar. 16, 2004

(65) Prior Publication Data

US 2005/0208708 A1 Sep. 22, 2005

(51) Int. Cl.
*H01L 21/00* (2006.01)
(52) U.S. Cl. .................. 438/118; 438/455
(58) Field of Classification Search .......... 438/118, 438/119, 406, 455; 257/783, E23.018, E23.166, 257/E21.514, E23.075
See application file for complete search history.

(56) References Cited

U.S. PATENT DOCUMENTS

| | | | |
|---|---|---|---|
| 5,508,197 A | 4/1996 | Hansen et al. | |
| 5,686,169 A | 11/1997 | Hassall et al. | |
| 5,915,170 A * | 6/1999 | Raab et al. | 438/118 |
| 5,952,420 A | 9/1999 | Senkus et al. | |
| 6,017,624 A | 1/2000 | Delgado et al. | |
| 6,197,145 B1 | 3/2001 | Todd et al. | |
| 6,210,518 B1 | 4/2001 | Lee et al. | |
| 6,228,678 B1 * | 5/2001 | Gilleo et al. | 438/108 |
| 6,344,260 B1 | 2/2002 | Lythgoe et al. | |
| 6,432,253 B1 * | 8/2002 | Chung | 156/295 |
| 6,580,035 B1 * | 6/2003 | Chung | 174/255 |
| 6,607,599 B1 * | 8/2003 | Jiang et al. | 118/504 |
| 6,662,440 B1 * | 12/2003 | Jiang et al. | 29/840 |
| 2002/0171132 A1 | 11/2002 | Buchwalter et al. | |
| 2003/0019009 A1 | 1/2003 | Feduzi et al. | |
| 2006/0121646 A1 * | 6/2006 | Koning et al. | 438/118 |

* cited by examiner

*Primary Examiner*—Matthew Smith
*Assistant Examiner*—Khiem D Nguyen

(57) ABSTRACT

An apparatus and method for an adhesive assembly for securing a printed circuit board to a substrate. The assembly provides a printing tool with a plurality of apertures defined therethrough. Preferably, the apertures have a top opening with a larger area than a bottom opening. The printing tool is placed upon one of the printed circuit board and/or substrate, and a liquid adhesive is printed onto the printing tool. The liquid adhesive forms islands of adhesive within each aperture. Removing the printing tool deforms each island to form a raised edge at a periphery of each island. A temporary liner can be placed on the raised edges to protect the adhesive until the printed circuit board can be assembled with the substrate.

12 Claims, 4 Drawing Sheets

100

ADHESIVE ASSEMBLY FOR A CIRCUIT BOARD

FIELD OF THE INVENTION

The present invention relates generally to the application of adhesives, and, in particular, to mechanically securing a circuit board to a substrate.

BACKGROUND OF THE INVENTION

Engine mounted electronic control units for automotive engines are subject to a high level of heat that can limit or impair their performance. Typically, in order to reduce the high level of heat and enhance thermal performance, a printed circuit board that includes control circuitry is affixed to a cooling plate. For example, in a direct engine mount application, a printed circuit board is affixed to an aluminum substrate. The substrate provides mechanical support for the printed circuit board and assists in the dissipation of heat generated by components on the printed circuit board, which heat is conductively transferred from the components to the underlying aluminum substrate.

In one prior art method, printed circuit boards are affixed to a substrate by use of a pressure sensitive adhesive (PSA) tape. When manufactured, the adhesive tape, or film, is encased in liners that protect the film during shipment and storage. The adhesive film is then punched by a converter and manually cut into appropriately sized sheets. The sheets are manually loaded into a lamination machine along with the printed circuit boards and substrates. A release liner must be manually peeled off of the film sheets. The film is then applied to the substrate and a printed circuit board is applied to the adhesive film, thereby securing the printed circuit board to the substrate.

Use of adhesive film poses several problems. It is a manual process when manufacturing operations are becoming increasingly automated. Mistakes made in the manual handling of the film results in film that must be scrapped. Use of an adhesive film in the assembly of electronic control units requires a batch-oven bake cycle to prevent blisters from forming in the film during solder reflow, which baking process is lengthy, as long as twelve hours, and is disruptive of a high volume manufacturing process. In addition, acrylic adhesive films suffer from high temperature instability, typically at temperatures well below maximum operating temperatures of high power field effect transistors (FETs) and the reflow temperatures of lead-free solders, thereby imposing constraints on the manufacturing process and on the operation of electronic control units that employ the adhesive films.

In another prior art method, printed circuit boards are affixed to a substrate by use of a B-stage epoxy adhesive. A release liner sheet can be placed on the semi-cured adhesive to protect the adhesive for shipment and storage. Before lamination the release liner must be manually peeled off of the adhesive. The lamination machine then secures the printed circuit board to the substrate.

Use of a B-stage epoxy adhesive poses several problems. Mistakes made in the handling of the adhesive and the release liner film results in product that must be scrapped. Moreover, the epoxy has outgassing problems and is flammable. In addition, the epoxy requires two curing cycles which adds to processing.

What is needed is a technique to be able to use a dispensed liquid adhesive without causing significant damage to the adhesive. It would also be of benefit if the technique could utilize low-cost release liners, such as common release liners or even plastic films, which can be easily peeled off without significantly affecting the adhesive bonding surface property of the adhesive.

DETAILED DESCRIPTION OF THE INVENTION

Figure 1:
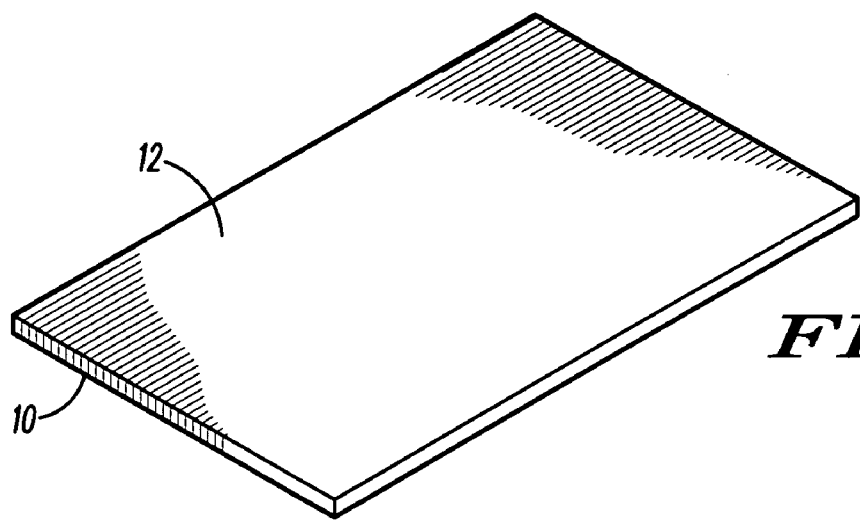
FIG. 1 is a perspective view of a substrate or printed circuit board with a surface.

The present invention provides an apparatus and method for applying adhesive for securing a printed circuit board to a substrate. The invention takes advantage of the adhesive application by allowing the use of a low cost release liner without causing significant damage to the adhesive upon removal of the release liner. Any type of release liner can be used, such as common paper release liners or even plastic films, which can be easily peeled off without significantly affecting the adhesive bonding surface property of the adhesive.

To address the need for a method and apparatus for securing a printed circuit board to a substrate, which method and apparatus do not require special handling of silicone-based adhesives and which method and apparatus may be implemented in a high volume manufacturing process, an adhesive assembly is implemented by providing a printing tool with a plurality of apertures defined therethrough. The printing tool can be a stencil or a screen with a defined emulsion layer. The printing tool is placed upon a surface of at least one of the printed circuit board and the substrate. Afterwards, a liquid adhesive is printed onto the surface of the printed circuit board and/or substrate through the printing tool, forming islands of adhesive within each aperture. The printing tool is removed upwardly and perpendicularly from the surface such that the printing tool deforms edges of the islands of the liquid adhesive to form a raised edge above an exposed major face of the adhesive at a periphery of an island. The adhesive is then cured to a tacky state. By providing raised edges on the islands a release liner can be applied to the adhesive wherein the release liner only touches the raised edges. Thereafter, when the release liner is peeled away, even if it well bonded to the raised edges and tears the edges, a substantial portion of the adhesive is undamaged.

Afterwards, a high pressure lamination process is performed to assemble a printed circuit board to the adhesive of the substrate. The lamination process deforms the raised edges on all the adhesive islands to be coplanar with an associated major face of each island of the adhesive.

Generally, one embodiment of the present invention encompasses a method for securing a printed circuit board to a substrate. The method includes a first step of providing a first printing tool with a first plurality of apertures defined therethrough. A next step includes placing the first printing tool upon a surface of at least one of the printed circuit board and the substrate. A next step includes printing a first liquid adhesive onto the surface through the first printing tool, the first liquid adhesive forming islands of adhesive within each aperture. A next step includes removing the first printing tool perpendicularly from the surface such that the first printing tool deforms edges of the islands of the first adhesive to form a raised edge above an exposed major face of the adhesive at a periphery of an island. A next step includes curing the first liquid adhesive to a tacky state.

Another embodiment of the present invention encompasses an adhesive assembly comprising: a substrate; a printed circuit board; and a cured first adhesive disposed in isolated islands between the printed circuit board and the substrate, the first adhesive formed with a raised edge at a periphery of each island. The assembly of the printed circuit board and substrate deforms the raised edges on all the islands to be coplanar with an associated major face of each island of the first adhesive.

The present invention may be more fully described with reference to FIGS. 1-10, which describe an adhesive assembly, in accordance with the present invention.

FIG. 1 shows a substrate 10 with a surface 12. It should be noted that the substrate 10 could also be substituted with the printed circuit board and be used equally well in the present invention. As assembled, the substrate 10 is designed to shield a printed circuit board and electronic components thereon from electrical charge which can damage the circuit board and electronic components. The substrate 10 also provides mechanical support for circuit board by being manufactured from materials that are rigid enough to provide a rigid mechanical support for the circuit board, that is, to function as a substrate or stabilizer, and that have elements designed to shield the electronic components from heat, water, chemicals, and electrostatic charge, such as aluminum, copper, steel, engineering grade plastic, ceramic, magnesium, and zinc or any material that is resistant to chemicals and elements commonly found in an automobile environment. Preferably, the substrate 10 is manufactured from aluminum. It is envisioned that substrate includes a single metal plate that is bent to surround seal the circuit board to prevent elements such as dust, water, and other chemicals from damaging the electronic components.

Figure 2:
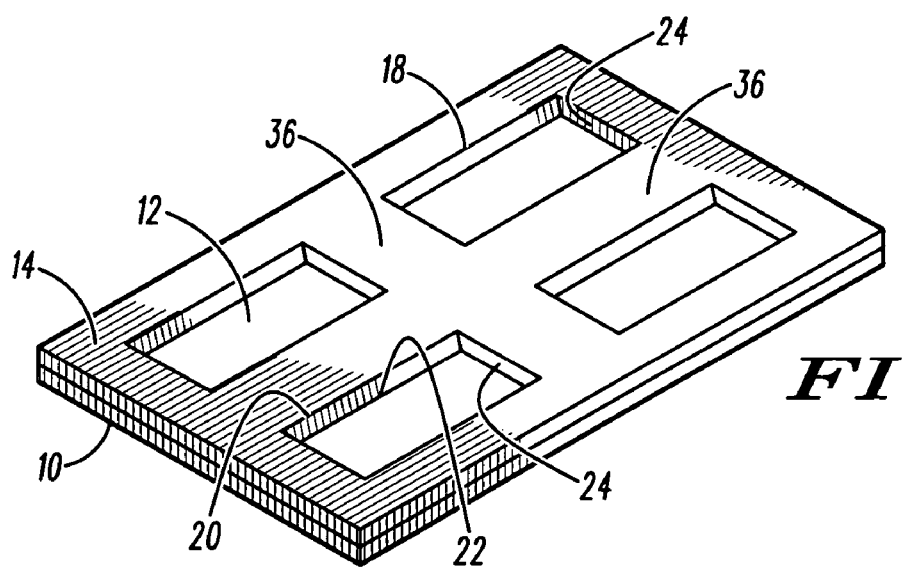
FIG. 2 is a perspective view of printing tool placed on the surface of FIG. 1, in accordance with the present invention.

FIG. 2 shows placement of a printing tool 14 onto the surface 12 of one or more of the substrate 10 (as shown) or of a printed circuit board (not represented). The printing tool 14 has a first plurality of apertures 18 defined between and top surface and a bottom surface of the printing tool 14. The printing tool can be a screen with defined emulsion pattern (not shown), but is preferably a stencil (as shown). Preferably, the printing tool is coated with a fluoro-polymer material such that silicone-based adhesives will not stick thereto. Although the printing tool is shown with rectangular apertures in a regular array, it should be recognized that all different configurations, shapes and orientations of the apertures can be supported in the present invention. For example, the apertures can be rotated by forty-five degrees and maintained in a regularly spaced array.

Figure 3:
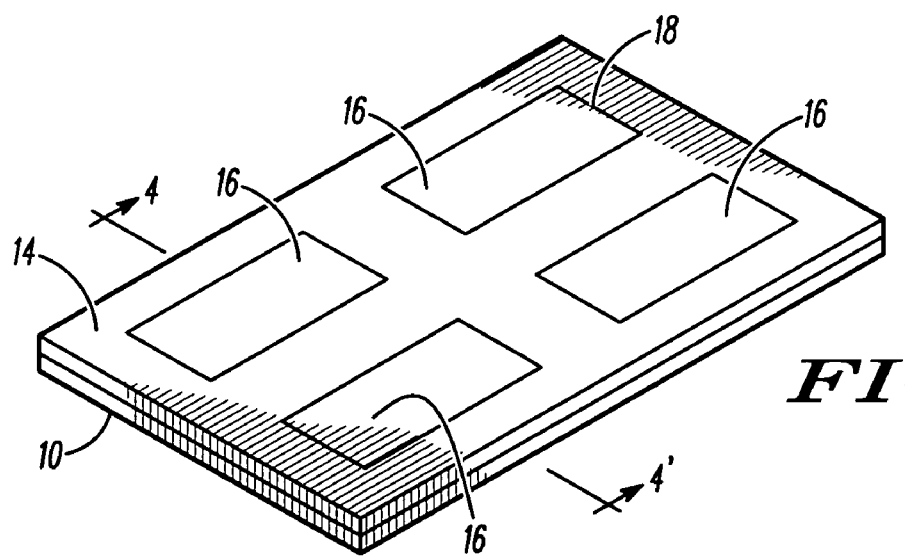
FIG. 3 is a perspective view of an adhesive printed onto the surface through the printing tool of FIG. 2, in accordance with the present invention.

FIG. 3 shows a thixotropic silicone-based liquid adhesive that has been printed onto the surface 12 through the printing tool 14, using techniques known in the art. Although, Dow Corning DC 7500 silicone is preferred, it should be recognized that all different types of adhesive (epoxy, urethane, etc.) can be used with success in the present invention. The liquid adhesive forms islands 16 of adhesive within each aperture 18, isolated from each other. The top of the islands are substantially flush with the top surface of the printing tool defining exposed major faces.

Figure 4:
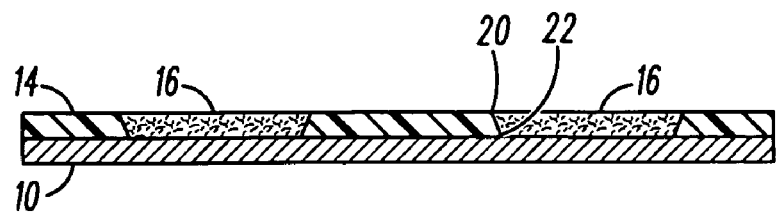
FIG. 4 is a cross-sectional view of FIG. 3.

FIG. 4 shows a cross-sectional view of the substrate 12, printing tool 14 and adhesive islands 16. A novel aspect of the printing tool is having the top 20 of at least one aperture have a larger area than a bottom 22 of the at least one aperture. This can be accomplished by cutting or trimming the apertures with a laser, for example. However, it should be recognized that any technique (e.g. molding, mechanical cutting, etc.) can be used with success to cut the apertures in this fashion. In addition, apertures with a top opening larger than a bottom opening can be provided not only in stencil form but also in a screen emulsion layer. In the embodiment shown the aperture has a trapezoidal cross-section. However, it should be recognized that many different shapes could be used equally well as long as the top 20 of the aperture has a larger area than a bottom 22 of the aperture. Also of note is that the aperture has at least one vertically-sided or straight-sided (i.e. straight up and down) portion (24 in FIG. 2), the significance of which will be explained below.

Figure 5:
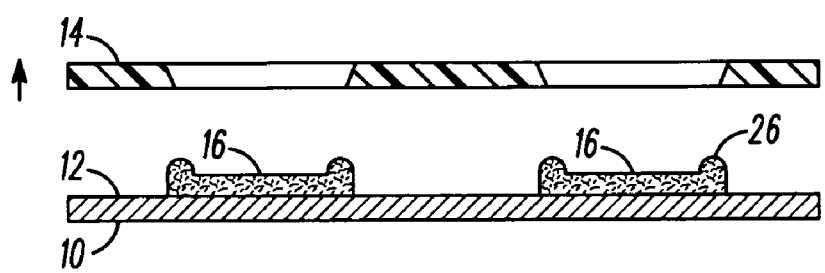
FIG. 5 is a cross-sectional view of FIG. 4 after removal of the printing tool, in accordance with the present invention.

FIG. 5 shows the removal of the printing tool 14 from the surface 12 of the substrate 10. The trapezoidal cross-section of the apertures serves in pulling excess adhesive material upwardly to form a raised edge 26, standoff or ridge on the island 16, which is typically rounded at the top. Because the adhesive has thixotropic properties, the raised edge will slump a negligible amount before the adhesive can be cured and will be maintained above the exposed major face of the adhesive islands. Fully curing the adhesive (e.g. curing Dow Corning DC 7500 at an elevated temperature for a predetermined amount of time) will drive off almost all of the volatiles of the adhesive resulting in a tacky surface on each island. Inasmuch as there are straight-sided portions (24 in FIG. 2) of each aperture, the raised edge 26 is provided around only a portion of a periphery of each island 16.

Figure 6:
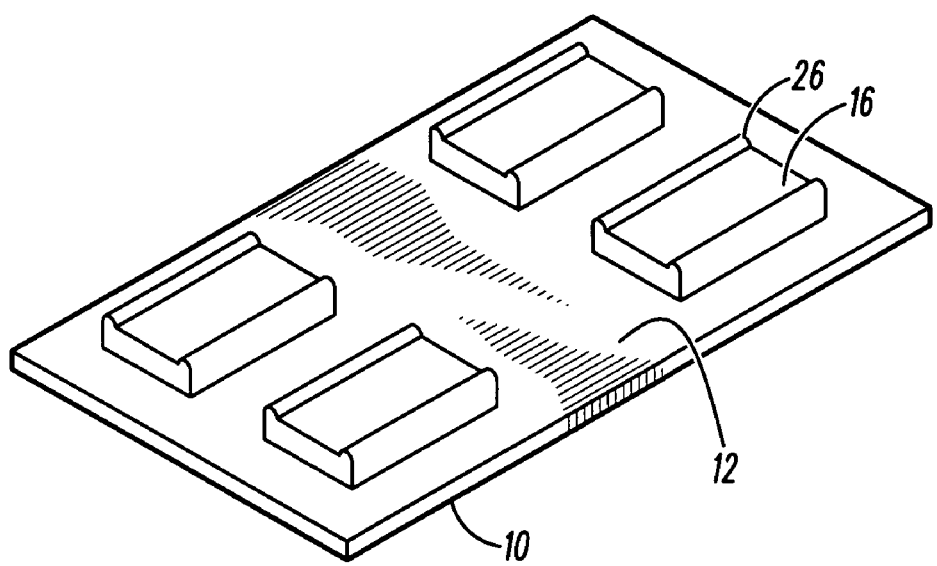
FIG. 6 is a perspective view of FIG. 5.

FIG. 6 shown the adhesive islands 16 with a raised edge 26 provided around only a portion of a periphery of each island 16. As shown, the raised edge is only on two sides of the islands. However, it is envisioned that the raised edge can be on three or even one side of the island. Alternatively, individual raised bumps (not shown) can be provided to form crenellations around a periphery of each island. Any of these scenarios will work equally well as long as any portion of the periphery of the island is not raised. The reason for leaving a gap in the raised portion is to prevent the trapping of air when the circuit board is laminated thereon, thereby providing maximum bonding and less chance for delamination during a subsequent solder reflow operation which can lift a flexible circuit board and cause component/solder defects. Solder reflow typically occurs at 220 C and any air pockets would be heated, resulting in a high pressure force towards delamination.

In practice, the adhesive is printed to a thickness of about 0.05 to 0.25 millimeters and the raised edges add about another ten to twenty percent in height (i.e. 0.005 to 0.025 mm, respectively). The release liner can be of coated paper or plastic film with a thickness of from about 0.05 mm to 0.5 mm. The printing tool will have a thickness of about 0.05 to 0.25 mm and preferably the apertures will be from approximately 1 mm to 4 mm square with streets therebetween of about 0.2 to 5.0 mm. The adhesive is preferably Dow Corning DC7500, which is cured at 125 C for about five minutes.

Figure 7:
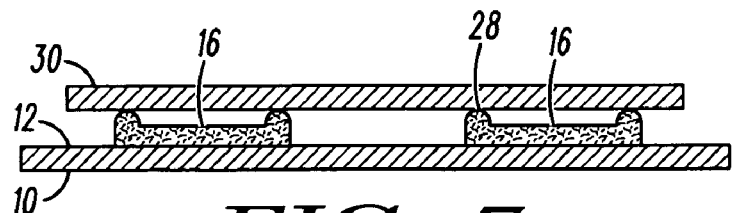
FIG. 7 is side view of FIG. 5 with application of the release liner on the adhesive, in accordance with the present invention.

FIG. 7 shows the placement of the release liner 30 onto the raised edges 28 of the adhesive islands 16. The use of the release liner 30 is to provide protection of the adhesive during shipping and storage. The release liner can be of any standard coated release paper or even plastic film. The thickness of the release liner and the dimensions of the apertures are chosen such that the release liner will not slump between the raised edges of the adhesive and touch the top surface of each island. Since the placement pressure is low, the contact area of the release liner is only on top of the small raised edges, making removal of the liner very easy due to the small amount of bonding force, and resulting in little damage to the adhesive.

Figure 8:
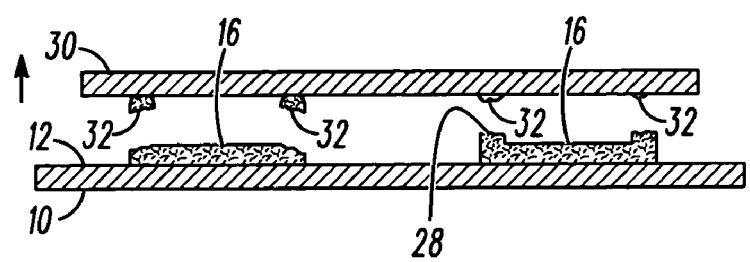
FIG. 8 is a side view of FIG. 7 after removal of the release liner, in accordance with the present invention.

FIG. 8 shows the peeling away of the release paper. Due to the nature of the silicone-based adhesive and coated release paper or plastic film, it is envisioned that the raised edges may become bonded to the release liner. In this case, upon removal of the liner 30 the raised edges 28 could be ripped off of the islands 16 leaving residual adhesive 32 on the release paper. The innovation of using the raised edges preserves the integrity of most of the major surface of the adhesive islands 16 for subsequent bonding.

Figure 9:
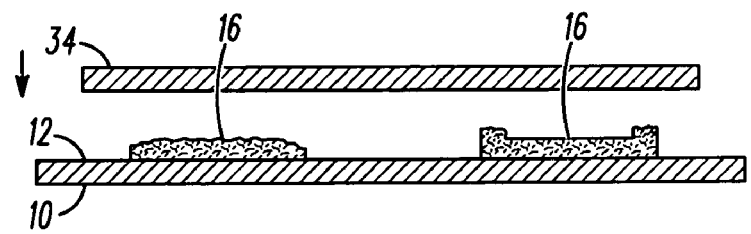
FIG. 9 is a side view of FIG. 8 showing the application of the printed circuit board and substrate, in accordance with the present invention.

FIG. 9 shows the laminating of a printed circuit board 34 to the adhesive. Of course, the lamination step works equally well if the adhesive was initially printed to the printed circuit board (as in FIGS. 1-3 for example) and the substrate is then laminated to the adhesive on the circuit board. In practice, the circuit board can be a rigid epoxy board or an FR4 flexible circuit board. However, any type of available circuit board material will work equally well in the present invention. Lamination of rigid circuit boards can be accomplished using approximately fifty pounds per square inch of force. Roll lamination of flexible circuit boards can be accomplished using approximately ninety pounds per square inch of force.

Figure 10:
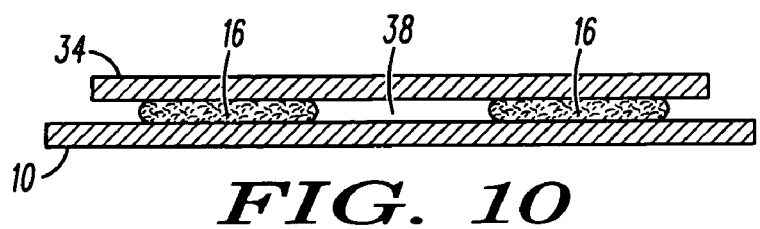
FIG. 10 is a side view of FIG. 9 after lamination of the printed circuit board and substrate, in accordance with the present invention.

FIG. 10 shows the final assembly of the circuit board 34 with the substrate 10 using the silicone-based adhesive 16. As can be seen, the step of laminating the printed circuit board to the substrate with the cured adhesive therebetween deforms any raised edges on the islands to be coplanar with the major face of the adhesive islands 16, allowing substantially full contact with the adhesive to provide bonding thereto.

As shown in FIG. 2, the printing tool is provided with connecting portions 36 around the apertures such that the islands formed after removal of the printing tool and after lamination of the complete assembly have connecting open pathways 38 defined therebetween to allow outgassing to an outside environment from between the laminated assembly of the printed circuit board and the substrate. Additionally, through vents or through-holes (plated or non-plated) can be milled through the printed circuit board to further assist outgassing.

Preferably, the printing tool uses straight connecting portions 36 surrounding a regular array of rectangular apertures 18 such that the islands 16 are aligned in a regular array having straight connecting pathways 38 defined therebetween. However, it should be recognized that all different configurations, shapes and orientations of the apertures can also be supported in the present invention. For example, the apertures can be rotated by forty-five degrees and maintained in a regularly spaced array, or even an irregularly spaced random pattern.

The portion 36 and aperture 18 can be arranged so that there is no open pathway 38 underneath a local site of the circuit board where a power component, such as a BGS or FET, is mounted, which requires high thermal dissipation, or underneath and local area of the circuit board that requires high dielectric isolation from the substrate.

Although the substrate of the final assembly provides heat dissipation for circuitry of the printed circuit board, it may be that additional heat sinking is needed. For example, power transistors or main processors may require further heat sinking. In this case, a second, thermally conductive adhesive, such as Bondline 2950, GE TSE 3281 G, or Emerson & Cummins CE3104, can be printed fully over the whole substrate, or preferably locally applied under those places of the circuit board requiring additional thermal sinking.

Figure 11:
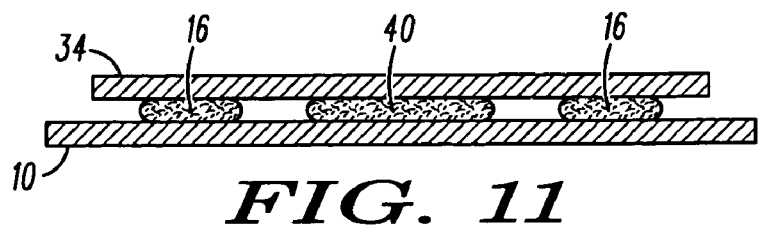
FIG. 11 is a further embodiment of the present invention.

FIG. 11 shows the addition of such second thermally conductive adhesive 40 to the previous adhesive assembly. This second adhesive can be directly dispensed or used in the same manner as previously explained for FIGS. 2-10. In particular, a second printing tool with a second plurality of apertures defined therethrough can be provided. Optionally, the thermally conductive adhesive can be applied to one of the substrate and circuit board while the first silicone liquid adhesive can be applied to the other of the substrate and circuit board. Alternatively, the thermally conductive adhesive can be printed and cured before the application of the first liquid silicone adhesive.

Preferably, the second plurality of apertures do not overlap the first plurality of apertures 18 of the first printing tool 14. However, this is not a requirement since the lamination step suitably deforms the adhesive to provide intimate contact with the printed circuit board. Therefore, it is possible to have the adhesives overlap, with either one overlapping on top of the other, or even be in between. The thickness of each adhesive can be controlled independently to provide proper adhesion during the lamination step. To proceed, the second printing tool is placed upon the surface, and the second thermally conductive liquid adhesive is printed onto the surface through the second printing tool. The second liquid adhesive forms second islands of thermally conductive liquid adhesive within each second aperture. The heights of second islands can be controlled with the thickness of the printing tool. Upon removal of the second printing tool from the surface, the second thermally conductive liquid adhesive can be partially cured.

Figure 12:
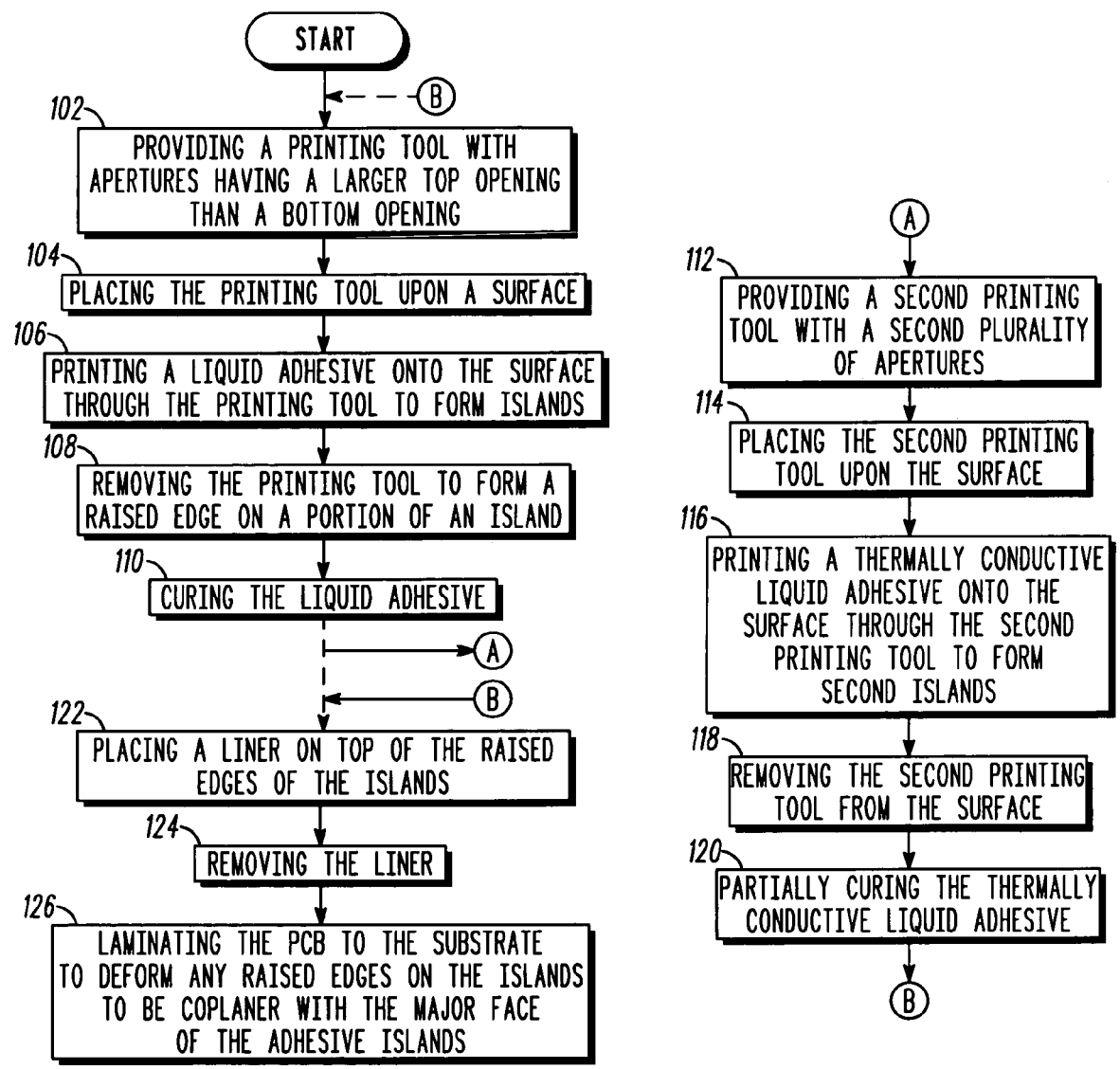
FIG. 12 is a flow chart of a method for adhesive assembly in accordance with the present invention.

FIG. 12 is a logic flow diagram for a method 100 for applying adhesive for securing a printed circuit board to a substrate. The method 100 includes a first step of providing 102 a printing tool with a plurality of apertures defined therethrough. The printing tool has connecting portions around the apertures such that the islands formed in the removing step have connecting open pathways defined therebetween to allow outgassing to an outside environment from between a laminated assembly of the printed circuit board and the substrate. Preferably, the printing tool has straight connecting portions surrounding rectangular apertures such that the islands formed in the removing step are aligned in a regular array having straight connecting pathways defined therebetween.

In particular, this step 102 provides apertures wherein the top of at least one aperture has a larger area than a bottom of the at least one aperture. As a result, in a subsequent removing step 108, the smaller area of the bottom of the aperture assists in pulling adhesive material upwardly to form the raised edge around only a portion of a periphery of each island.

A next step includes placing 104 or overlaying the printing tool upon a surface of at least one of the printed circuit board and the substrate.

A next step includes printing 106 a silicone-based liquid adhesive onto the surface through the printing tool, the liquid adhesive forming islands of adhesive within each aperture. Printing can be done with known printing processes.

A next step includes removing 108 the printing tool upwardly and perpendicularly from the surface such that the printing tool deforms edges of the islands of the adhesive to form a raised edge above an exposed major face of the adhesive at a periphery of each island.

A next step includes curing 110 the liquid adhesive. Preferably, this is a heat cure such as being passed through a conveyor oven for approximately five minutes at approximately 125 C, for example, to make the adhesive tacky. Other types of pressure sensitive adhesives with other curing processes (e.g. ultraviolet cure, moisture cure, etc.) are also envisioned. The thermal treatment of the adhesive also eliminates moisture and volatile materials from the adhesive. This step produces a tacky adhesive that slumps a negligible amount such that the raised edge is maintained above the exposed major face of the adhesive islands.

A next step includes providing 112 a second printing tool with a second plurality of apertures defined therethrough.

A next step includes placing 114 the second printing tool upon the surface.

A next step includes printing 116 a second thermally conductive liquid adhesive onto the surface through the second printing tool. The second liquid adhesive forms second islands of thermally conductive liquid adhesive within each aperture.

A next step includes removing 118 the second printing tool from the surface.

A next step includes partially curing 120 the second liquid adhesive.

A next step includes placing 122 a release liner on top of the adhesive, such that the liner contacts the raised edge of a plurality of islands.

A next step includes removing 124 the release liner before laminating the printed circuit board to the substrate.

A next step includes laminating 126 the printed circuit board to the substrate with the cured adhesive therebetween to deform any raised edges on the islands to be coplanar with the major face of the adhesive islands. This step applies pressure to the circuit board, for example by passing a roller over the circuit board, to secure the circuit board to the adhesive on the substrate, or vice versa. Preferably, the tacky adhesive is sufficiently cured when the circuit board is applied that the application of pressure will not cause the adhesive to spread. The adhesive preferably underlies a sufficient portion of circuit board such that the adhesive securely affixes circuit board to substrate and provides an acceptable thermal path between the substrate and the circuit board so as to thermally couple any high heat generating components to the substrate.

Subsequent to the adhesive assembly, components can be assembled (not shown) on the printed circuit board. For example, solder paste can be printed onto the printed circuit board and components are placed on the printed circuit board in accordance with conventional printed circuit board component population techniques, such as solder reflow processing. Preferably, the components are surface mountable components that may be auto-placed on printed circuit board, thereby providing a maximally automated process of assembling an electronic control unit. However, those who are of ordinary skill in the art realize that components need not be surface mountable. For example, components may be through-hole parts that may be manually placed on the printed circuit board.

By using a silicone-based liquid adhesive to secure printed circuit board to a substrate, the process of adhesive assembling completely automated, reducing the costs and waste inherent in the use of a manually intensive adhesive film. Further cost reduction arises from the printing of adhesive instead of punching holes in, and die cutting, the adhesive film. Single cure system adhesives such as silicone are more thermally stable and clean than acrylic or epoxy adhesive films and may be exposed to significantly higher temperatures than acrylic adhesive films before degrading in performance, thereby expanding the manufacturing and operating temperature range of electronic control unit.

While the present invention has been particularly shown and described with reference to particular embodiments thereof, it will be understood by those skilled in the art that various changes may be made and equivalents substituted for elements thereof without departing from the broad scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. A method for applying adhesive for securing a printed circuit board to a substrate, the method comprising steps of:
   providing a first printing tool with a first plurality of apertures defined therethrough, wherein a top of at least one aperature has a larger area than a bottom of the at least one aperature;
   placing the first printing tool upon a surface of at least one of the printed circuit board and the substrate;
   printing a first liquid adhesive onto the surface through the first printing tool, the first liquid adhesive forming islands of adhesive within each aperture;
   removing the first printing tool perpendicularly from the surface such that the first printing tool deforms edges of the islands of the first adhesive to form a raised edge above an exposed major face of the adhesive at a periphery of an island such that the smaller area of the bottom of the aperature assists in pulling adhesive material upwardly to form the raised edge around only a portion of a periphery of each island;
   curing the first liquid adhesive;
   placing a liner on top of the first adhesive, such that the liner contacts the raised edge of a plurality of islands; and
   removing the liner which includes residual adhesive, whereby the integrity of most of a major surface of the adhesive island is preserved before laminating the printed circuit board to the substrate.

2. The method of claim 1, wherein the first liquid adhesive is a silicone-based adhesive.

3. The method of claim 1, wherein the step of curing the first liquid adhesive produces a tacky adhesive that slumps a negligible amount such that the raised edge is maintained above the exposed major face of the adhesive islands.

4. The method of claim 1, wherein the providing step includes providing the first printing tool with connecting portions around the apertures such that the islands formed in the removing step have connecting open pathways defined therebetween to allow outgassing to an outside environment from between a laminated assembly of the printed circuit board and the substrate.

5. The method of claim 1, wherein the providing step includes providing the first printing tool with straight connecting portions surrounding rectangular apertures such that the islands formed in the removing step are aligned in a regular array having straight connecting pathways defined therebetween.

6. The method of claim 1, further comprising the steps of:
   providing a second printing tool with a second plurality of apertures defined therethrough;
   placing the second printing tool upon the surface;
   printing a second thermally conductive liquid adhesive onto the surface through the second printing tool, the second liquid adhesive forming second islands of thermally conductive liquid adhesive within each aperture;
   removing the second printing tool from the surface; and
   partially curing the second liquid adhesive.

7. The method of claim 1, further comprising the step of laminating the printed circuit board to the substrate with the cured adhesive therebetween to deform any raised edges on the islands to be coplanar with the major face of the adhesive islands.

8. A method for applying adhesive for securing a printed circuit board to a substrate, the method comprising steps of:
   providing a first printing tool with a first plurality of apertures defined therethrough, wherein a top of at least one apertures has a larger area than a bottom of the at least one apertures;
   placing the first printing tool upon a surface of at least one of the printed circuit board and the substrate;
   printing a first liquid adhesive onto the surface through the first printing tool, the first liquid adhesive forming islands of adhesive within each aperture;
   removing the first printing tool perpendicularly from the surface such that the smaller area of the bottom of the at least one aperture pulls adhesive material upwardly to form a raised edge above an exposed major face of the adhesive around only a portion of a periphery of an island such that the smaller area of the bottom of the aperature assists in pulling adhesive material upwardly to form the raised edge around only a portion of a periphery of each island;
   curing the first liquid adhesive to produce a tacky adhesive that slumps a negligible amount such that the raised edge is maintained above the exposed major face of the adhesive islands;
   placing a liner on top of the first adhesive, such that the liner contacts the raised edge of a plurality of islands;
   removing the liner which includes residual adhesive, whereby the integrity of most of a major surface of the adhesive island is preserved; and
   laminating the printed circuit board to the substrate with the cured adhesive therebetween to deform any raised edges on the islands to be coplanar with the major face of the adhesive islands.

9. The method of claim 8, wherein the first liquid adhesive is a silicone-based adhesive.

10. The method of claim 8, further comprising the steps of:
    placing a liner on top of the first adhesive, such that the liner contacts the raised edge of a plurality of islands; and
    removing the liner before laminating the printed circuit board to the substrate.

11. The method of claim 8, wherein the providing step includes providing the first printing tool with connecting portions around the apertures such that the islands formed in the removing step have connecting open pathways defined therebetween to allow outgassing to an outside environment from between a laminated assembly of the printed circuit board and the substrate.

12. The method of claim 8, further comprising the steps of:
    providing a second printing tool with a second plurality of apertures defined therethrough;
    placing the second printing tool upon the surface;
    printing a second thermally conductive liquid adhesive onto the surface through the second printing tool, the second liquid adhesive forming second islands of thermally conductive liquid adhesive within each aperture;
    removing the second printing tool from the surface; and
    partially curing the second liquid adhesive.

* * * * *